(12) United States Patent
Duvaut et al.

(10) Patent No.: US 7,457,368 B2
(45) Date of Patent: Nov. 25, 2008

(54) MULTILEVEL CHANNEL CODING IN ADSL

(75) Inventors: Patrick Duvaut, Tinton Falls, NJ (US); Ehud Langberg, Wayside, NJ (US); Julien Pons, Eatonton, NJ (US); William Scholtz, Red Bank, NJ (US)

(73) Assignee: Brooktree Broadband Holding, Inc., Newport Beach, CA (US)

( * ) Notice: Subject to any disclaimer, the term of this patent is extended or adjusted under 35 U.S.C. 154(b) by 600 days.

(21) Appl. No.: 10/860,286

(22) Filed: Jun. 4, 2004

(65) Prior Publication Data

US 2005/0010853 A1 Jan. 13, 2005

Related U.S. Application Data

(60) Provisional application No. 60/475,907, filed on Jun. 5, 2003.

(51) Int. Cl.
*H04L 5/12* (2006.01)
(52) U.S. Cl. .................................................. 375/265
(58) Field of Classification Search ................. 375/265; 704/242; 714/792
See application file for complete search history.

(56) References Cited

U.S. PATENT DOCUMENTS

| | | | |
|---|---|---|---|
| 6,628,704 B1 * | 9/2003 | Long et al. | 375/219 |
| 6,671,327 B1 * | 12/2003 | Jin | 375/265 |
| 7,065,147 B2 * | 6/2006 | Ophir et al. | 375/265 |
| 2002/0150167 A1 * | 10/2002 | Demjanenko et al. | 375/259 |

OTHER PUBLICATIONS

Ungerboeck, "Channel Coding With Multilevel/Phase Signals," IEEE Transactions On Information Theory, vol. IT-28, No. 1, Jan. 1982, pp. 55-67.
Zhang et al., "Turbo Coding in ADSL DMT Systems," IEEE, 2001, pp. 151-155.
Li et al., "A New Turbo Coded QAM Scheme with Very Low Decoding Complexity for ADSL System," IEEE, 2001, pp. 349-353.
Imai et al., "A New Multilevel Coding Method Using Error-Correcting Codes," IEEE Transactions on Information Theory, vol. IT-23, No. 3, 1977, pp. 371-377.
Berrou et al., "Near Shannon Limit Error-Correcting Coding and Decoding: Turbo-Codes (1)," IEEE, 1993, pp. 1064-1070.

(Continued)

*Primary Examiner*—Sam K Ahn
(74) *Attorney, Agent, or Firm*—Thomas, Kayden, Horstemeyer & Risley LLP

(57) ABSTRACT

Disclosed herein are various techniques for multilevel channel coding. For a given binary word comprising a plurality of bits, the least-significant bit may be encoded by a boosted coding technique, such as turbo channel coding or low density parity check (LDPC) channel coding. A subset of the remaining bits of the binary word may be encoded using trellis coded modulation (TCM) coding. The results of the boosted channel coding and the TCM coding may be mapped to one or more symbols. The one or more symbols then may be transmitted to a receiver using transmission techniques well known to those skilled in the art. The present invention finds particular benefit in digital subscriber line (DSL)-based systems in accord with the ITU G.922.1 Recommendation and similar standards.

22 Claims, 3 Drawing Sheets

OTHER PUBLICATIONS

Benedetto et al., "Design of Parallel Concatenated Convolutional Codes," IEEE Transactions on Communications, vol. 44, No. 5, May 1996, pp. 591-600.

Rajpal et al., "Multidimensional Trellis Coded Phase Modulation Using a Multilevel Concatenation Approach Part I: Code Design," IEEE Transactions on Communications, vol. 45, No. 1, Jan. 1997, pp. 64-72.

Wei, "Trellis-Coded Modulation with Multidimensional Constellations," IEEE Transactions on Information Theory, vol. IT-33, No. 4, Jul. 1987, pp. 483-501.

Ungerboeck, Trellis-Coded Modulation with Redundant Signal Sets Part II: State of the Art, IEEE Communications Magazine, vol. 25, No. 2, Feb. 1987, pp. 12-21.

Dr. Dennis J. Rauschmayer, "ADSL/VDSL Principles," Macmillan Technology Series, 1999, pp. 172-181.

International Telecommunications Union, Recommendation G.992.1, Approved in Jul. 1999, "Asymmetrical digital subscriber line (ADSL) transceivers," pp. 1-240.

Zhang et al., "Turbo Coding for Transmission over ADSL," Communication Technology Proceedings, WCC ICCT 2000, vol. 1, pp. 124-131, Aug. 2000.

* cited by examiner

MULTILEVEL CHANNEL CODING IN ADSL

CROSS-REFERENCE TO RELATED APPLICATIONS

The present application claims priority to U.S. Provisional Patent Application Ser. No. 60/475,907 filed Jun. 5, 2003, entitled "MULTILEVEL CHANNEL CODING IN ADSL," to Duvant et al., the disclosure of which is expressly incorporated by reference herein in its entirety.

FIELD OF THE INVENTION

The present invention relates generally to channel coding in data transmission systems and more particularly to channel coding using multiple encoding techniques in trellis coded modulation-based data transmission systems.

BACKGROUND OF THE INVENTION

Trellis coded modulation (TCM) frequently is used in data transmission systems having band-limited channels. By incorporating both coding and modulation, TCM often allows for redundancy because the number of symbols in the resulting constellation is larger than required for the modulation format and for error checking as only certain sequences of symbols are permitted due to the interrelationship between symbols created by convolutional coding.

Referring now to FIG. 1, a typical implementation of TCM in a conventional system is illustrated as described by the International Telecommunications Union (ITU) Recommendation G.922.1 ("the G.992.1 Recommendation"). The G.922.1 Recommendation describes a standard for Asymmetric Digital Subscriber Line (ADSL) systems whereby digital data may be transmitted using analog signaling over relatively long distances. The illustrated conventional TCM encoder 100 often is used to facilitate error control in such transmissions.

In G.992.1-based systems, the coding of data for transmission generally comprises an outer coding scheme followed by interleaving and then an inner coding scheme, as is well known in the art. TCM typically is implemented as an inner coding technique whereby a sequence of binary words representing the data to be transmitted is coded and mapped to a symbol of a constellation. Further processing of the symbol generally occurs and a representation of this symbol then may be transmitted by analog means to a receiver where it is demapped and decoded to regenerate the original transmitted binary word. To illustrate, a binary word $u=(u_m, \ldots, u_5, u_4, u_3, u_2, u_1)$, where $u_1$ is the least significant bit (LSB), is processed by providing $u_1$, $u_2$, $u_3$ to a TCM module 102. The TCM module 102 typically includes a rate 2/3 or 1/2 convolution encoder 104 to process $u_1$ and $u_2$ (the next-to-least significant bit) to generate $u_0$ using a convolutional coding technique. The output of the convolution encoder 104 (i.e., $u_0$, $u_1$, $u_2$), along with $u_3$, then is processed by a coset generation module 106 to generate two binary words $v=(v_{m-y}, \ldots, v_1, v_0)$ and $w=(w_{y-l}, \ldots, w_1, w_0)$ from four-dimensional (4D) cosets using mapping by set-partitioning. The binary words v and w then may be mapped by a 4D mapping module 108 to generate a symbol as described by the G.992.1 Recommendation.

Conventional TCM techniques, such as the one described above, often provide an adequate coding gain for a given bit error rate (BER) and spectral efficiency. In certain instances, such as the transmission of data over long distances or in environments having considerable signal impairments, it may be desirable to use a coding technique that provides an improved coding gain compared to TCM. These improved coding techniques, including, for example, convolutional turbo coding, block turbo coding and low density parity check (LDPC) coding, often provide an improved coding gain but at the cost of a lower error floor compared to TCM.

SUMMARY OF THE INVENTION

The present invention mitigates or solves the above-identified limitations in known solutions, as well as other unspecified deficiencies in known solutions. A number of advantages associated with the present invention are readily evident to those skilled in the art, including economy of design and resources, transparent operation, cost savings, etc.

In accordance with one embodiment of the present invention, a method for channel encoding a binary word comprising a plurality of bits is provided. The method comprises the steps of encoding a least-significant bit of the plurality of bits using turbo coding or low density parity check (LDPC) coding and encoding a subset of the plurality of bits using trellis coded modulation (TCM), the subset of bits excluding the least-significant bit. The subset of bits preferably includes the next-to-least significant bit of the binary word. The method further may comprise the step of mapping at least one symbol based at least in part on a result of the encoding of the least-significant bit and a result of the encoding of the subset of bits. The mapping may include four-dimensional mapping.

In accordance with another embodiment of the present invention, a multilevel channel encoder is provided. The multilevel channel encoder includes means for encoding a least-significant bit of the plurality of bits using turbo coding or low density parity check (LDPC) coding and means for encoding a subset of the plurality of bits using trellis coded modulation (TCM), the subset of bits excluding the least-significant bit. The multilevel channel encoder further may comprise means for mapping at least one symbol based at least in part on a result of the encoding of the least-significant bit and a result of the encoding of the subset of bits. The means for encoding the least-significant bit may include a set of executable instructions adapted to manipulate a processor to encode the least-significant bit of the plurality of bits using turbo coding or low density parity check (LDPC) coding. Likewise, the means for encoding the subset of bits may include a set of executable instructions adapted to manipulate a processor to encode the subset of bits using TCM.

In accordance with yet another embodiment of the present invention, a computer readable medium for channel coding a plurality of bits is provided. The computer readable medium comprises a set of executable instructions adapted to manipulate a processor to encode a least-significant bit of the plurality of bits using turbo coding or low density parity check (LDPC) coding and encode a subset of the plurality of bits using trellis coded modulation (TCM), the subset of bits excluding the least-significant bit. The set of executable instructions may further comprise instructions adapted to manipulate a processor to map at least one symbol based at least in part on a result of the encoding of the least-significant bit and a result of the encoding of the subset of bits.

Still further features and advantages of the present invention are identified in the ensuing description, with reference to the drawings identified below.

BRIEF DESCRIPTION OF THE DRAWINGS

The purpose and advantages of the present invention will be apparent to those of ordinary skill in the art from the following detailed description in conjunction with the appended drawings in which like reference characters are used to indicate like elements, and in which.

DETAILED DESCRIPTION OF THE INVENTION

The following description is intended to convey a thorough understanding of the present invention by providing a number of specific embodiments and details involving multilevel channel coding. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

The various techniques of the present invention are discussed below in the context of ADSL and the G.992.1 Recommendation (e.g., using 16-TCM and 4D mapping) for ease of illustration. Those skilled in the art may utilize the exemplary multilevel channel coding techniques described herein in other contexts without departing from the spirit or the scope of the present invention.

Figure 1:
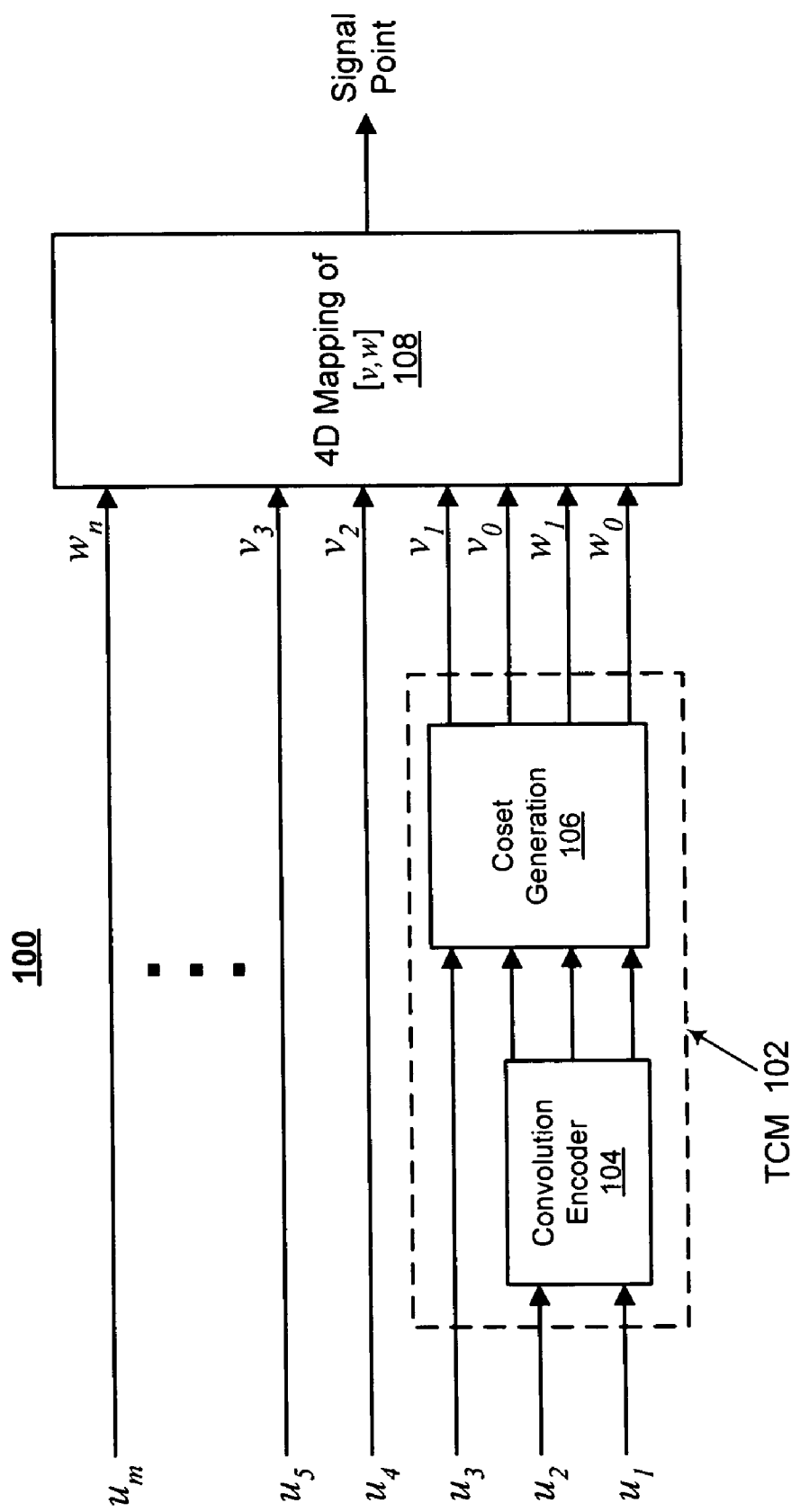
FIG. 1 is a schematic diagram illustrating a conventional trellis coded modulation (TCM) encoder for channel coding.
Figure 2:
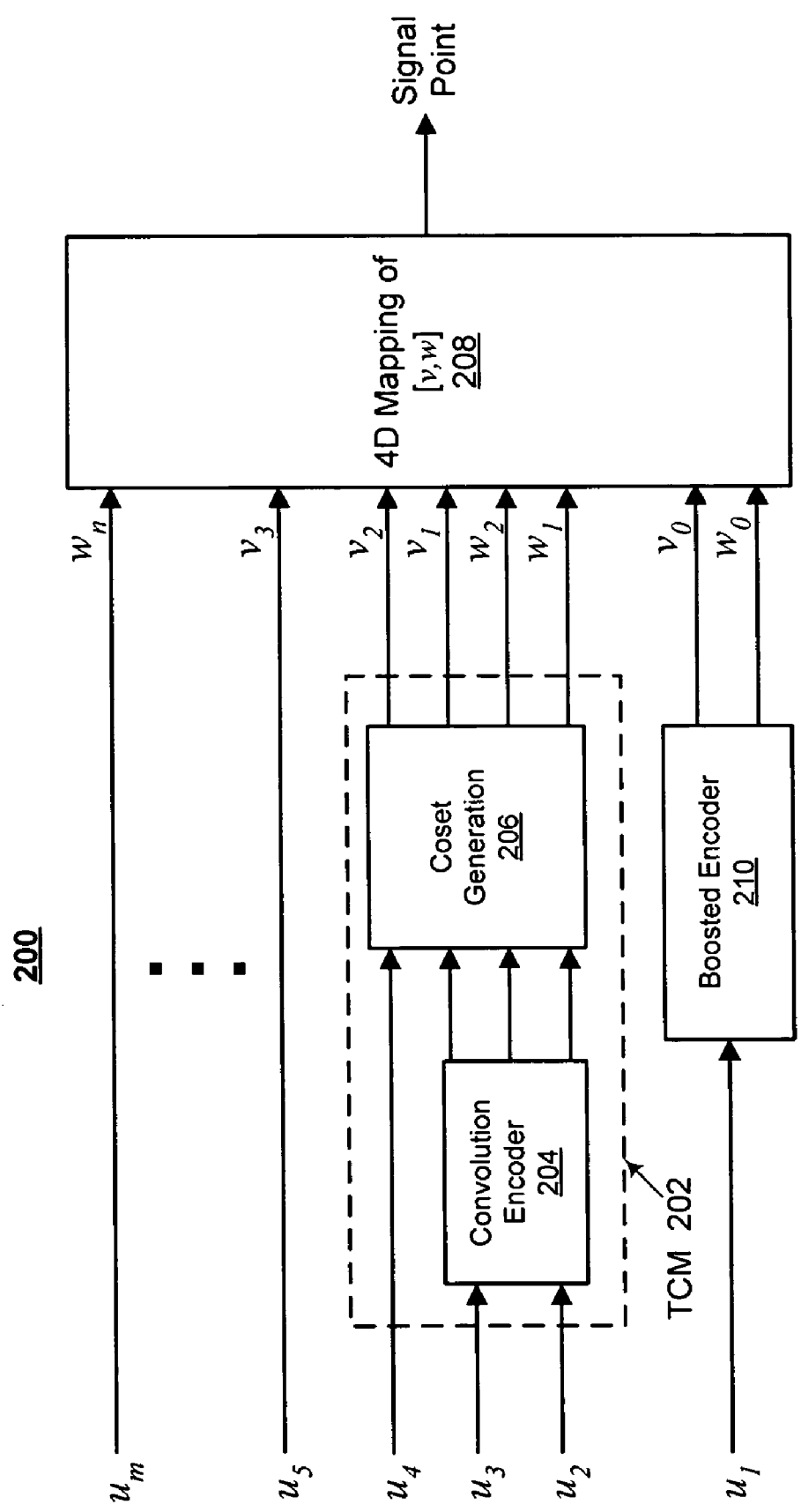
FIG. 2 is a schematic diagram illustrating an exemplary multilevel channel encoder in accordance with at least one embodiment of the present invention.

Referring now to FIG. 2, an exemplary multilevel channel encoder 200 is illustrated in accordance with at least one embodiment of the present invention. In the illustrated example, the multilevel channel encoder 200 implements a TCM module 202 having a convolution encoder 204 (analogous to the convolution encoder 104, FIG. 1) and a coset generation module 206 (analogous to the coset generation module 106, FIG. 1). The multilevel channel encoder 200 also may include a mapping module 208 (analogous to the mapping module 108, FIG. 1). Unlike conventional TCM encoders, however, the multilevel channel encoder 200 further may include a boosted encoder 210. Any of a variety of channel coding techniques having improved coding gains compared to TCM may be implemented by the boosted encoder 210, including, but not limited to, convolutional turbo coding, block turbo coding, and low density parity check (LDPC) coding.

The components of the multilevel encoder 200 may be implemented in hardware, software, firmware or a combination thereof. For example, the multilevel encoder 200 preferably may be implemented in an ADSL transmitter (also referred to as an ATU-T) for encoding and mapping data for transmission over a subscriber line. In this case, the components of the multilevel encoder 200 may be implemented as one or more sets of executable instructions adapted to manipulate one or more processors of the ADSL transmitter to perform the described functions. The one or more processors may include, for example, a central processing unit (CPU), application specific integrated circuit (ASIC), a digital signal processor (DSP), and the like.

As with the conventional TCM module 102 of FIG. 1, the TCM module 202 may Be adapted to generate a subset of the bits of the binary words v and w using the Convolution encoder 204 and coset generation module 206 which then are used by the mapping module 208 to generate a symbol as described by, for example, the G.992.1 Recommendation. However, rather than providing the least significant bit $u_1$ and a certain number of the preceding more significant bits (e.g., $u_2$ and $u_3$) to the TCM module 202, in at least one embodiment the TCM module 202 may be "shifted up" and the next-to-least significant bit $u_2$ (or alternatively some other more-significant bit) and a certain number of more significant bits preceding the next-to-least significant bit (e.g., $u_3$ and $u_4$) may be used by the convolution encoder 204 and coset generation module 206 to generate a subset of the bits of the binary words v and w. To illustrate using the example of FIG. 2, rather than using $u_1$, $u_2$, $u_3$ to generate the bits $v_0$, $v_1$, $w_0$, $w_1$ of the binary words v and w as typically would occur in a conventional 16-TCM encoder, the bits $u_2$, $u_3$, $u_4$ may be provided to the TCM module 202 to generate the bits $v_1$, $v_2$, $w_1$, $w_2$ of the binary words v and w. In this case, the bits $u_2$ and $u_3$ may be provided to the convolution encoder 204 and the output of the convolution encoder, along with the bit $u_4$ may be provided to the coset generation module 206 for the generation of the bits $v_1$, $v_2$, $w_1$, $w_2$ in a manner similar to, for example, those described by the G.992.1 Recommendation.

In some instances, it may be preferred to have the enhanced, or boosted coding, performed on the least significant bit $u_1$ as it often is desirable to ensure that it is "perfect." By "shifting" the TCM module 202 to the next-to-least significant bit, the least significant bit $u_1$ is available for coding by a technique that preferably provides a greater coding gain, such as, for example, convolutional turbo coding, block turbo coding and LDPC-based coding. Accordingly, in at least one embodiment, the least significant bit $u_1$ may be encoded by the boosted encoder 210 to generate bits $v_0$ and $w_0$ of the binary words v and w, respectively. The bits $v_0$ and $w_0$, along with the bits $v_1$, $v_2$, $w_1$, $w_2$ from the coset generation module 206, then may be provided to the mapping module 208 in mapping one or more symbols for transmission. Any of a variety of mapping techniques may be implemented by the mapping module 208, preferably including the mapping techniques described in the G.992.1 Recommendation.

It will be appreciated that turbo coding and LDPC coding techniques. ("boosted" or "enhanced" coding techniques collectively) typically have a greater coding gain compared to conventional TCM techniques while conventional TCM techniques generally have a better error floor for a given spectral efficiency. By combining TCM and a boosted coding technique, however, the multilevel channel encoder 200 demonstrates a greater coding gain for a particular spectral efficiency and bit error rate (BER) than TCM or boosted encoding alone without significantly affecting the error floor.

Figure 3:
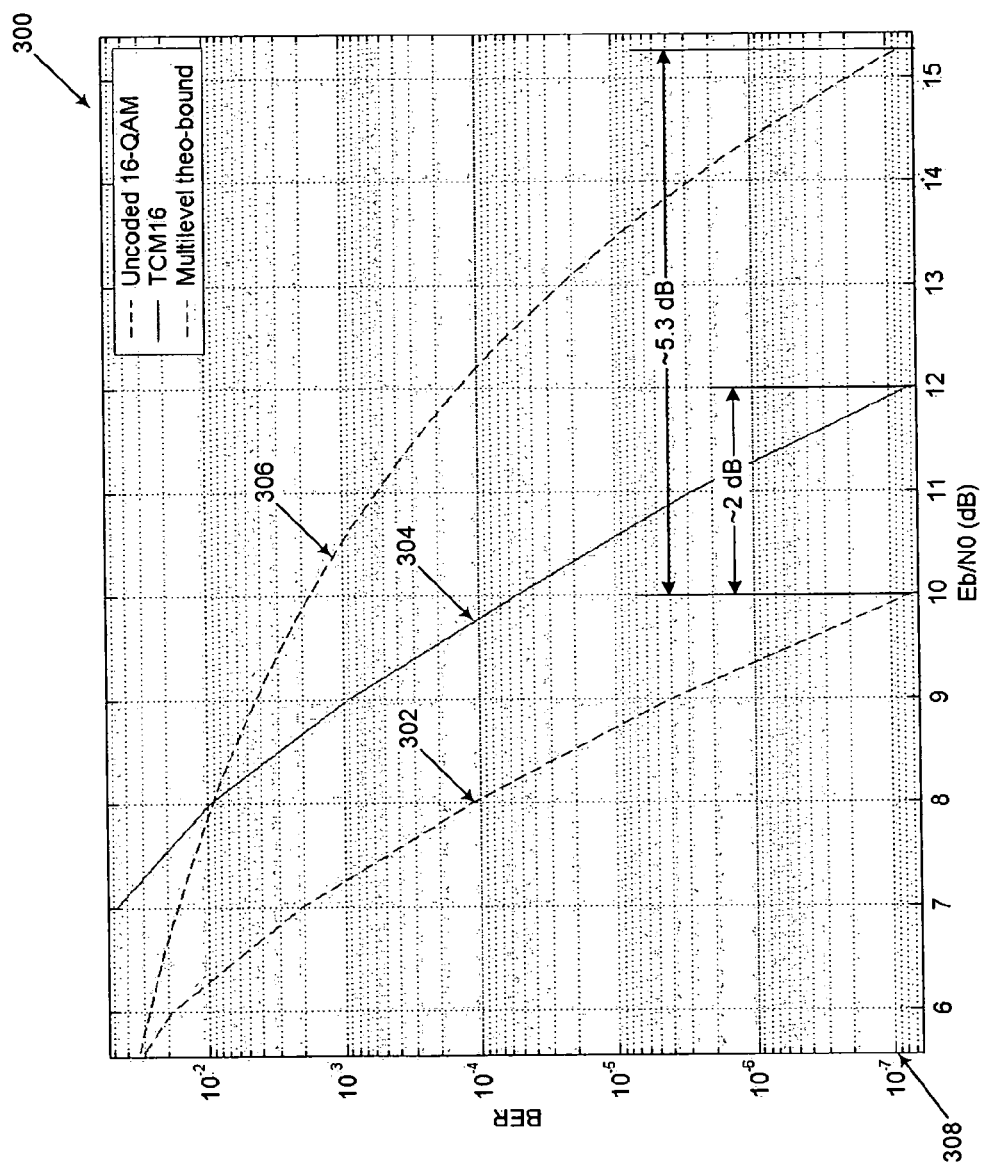
FIG. 3 is a chart illustrating an exemplary simulated plot of a bit error rate for the multilevel channel encoding technique of FIG. 2 for various signal-to-noise ratios per bit compared to bit error rates for an uncoded quadrature amplitude modulation technique and the conventional trellis coded modulation technique of FIG. 1 in accordance with at least one embodiment of the present invention.

Referring to FIG. 3, an exemplary plot 300 illustrating a performance comparison of a 16-QAM technique, a conventional 16-TCM technique and the technique employed by the multilevel channel encoder 200 is shown. The exemplary plot 300 represents a simulated performance of the 16-QAM technique (line 306), the conventional 16-TCM technique (line 304) and the multilevel channel encoding technique (line 302) for a given spectral efficiency of 4 bits/second/hertz (Hz). The x-axis of plot 300 represents the signal-to-noise ratio (SNR) per bit in decibels (dB) and the y-axis represents the BER in error bits per second. As the plot 300 illustrates, the conventional 16-TCM technique demonstrates approximately a 3.3 dB coding gain over uncoded 16-QAM at a BER of $10^{-7}$ erroneous bits/second. In contrast, by shifting the TCM process to start with the next-to-least significant bit and encoding the least-significant bit using an encoding technique with a greater coding gain, the multilevel channel encoder 200 demonstrates approximately a 5.3 dB coding gain over uncoded 16-QAM at a BER of $10^{-7}$ erroneous bits/second (reference 308) and, therefore, approximately a 2 dB coding gain over conventional TCM coding. Consequently, the multilevel channel encoder 200 in this instance may be beneficially implemented to transmit data over greater distances and/or in environments having more signal interference than typically would be possible for conventional TCM techniques.

In accordance with one embodiment of the present invention, a method for channel encoding a binary word comprising a plurality of bits is provided. The method comprises the steps of encoding a least-significant bit of the plurality of bits using turbo coding or low density parity check (LDPC) coding and encoding a subset of the plurality of bits using trellis coded modulation (TCM), the subset of bits excluding the least-significant bit. The subset of bits preferably includes the next-to-least significant bit of the binary word. The method further may comprise the step of mapping at least one symbol based at least in part on a result of the encoding of the least-significant bit and a result of the encoding of the subset of bits. The mapping may include four-dimensional mapping.

In accordance with another embodiment of the present invention, a multilevel channel encoder is provided. The multilevel channel encoder includes means for encoding a least-significant bit of the plurality of bits using turbo coding or low density parity check (LDPC) coding and means for encoding a subset of the plurality of bits using trellis coded modulation (TCM), the subset of bits excluding the least-significant bit. The multilevel channel encoder further may comprise means for mapping at least one symbol based at least in part on a result of the encoding of the least-significant bit and a result of the encoding of the subset of bits. The means for encoding the least-significant bit may include a set of executable instructions adapted to manipulate a processor to encode the least-significant bit of the plurality of bits using turbo coding or low density parity check (LDPC) coding. Likewise, the means for encoding the subset of bits may include a set of executable instructions adapted to manipulate a processor to encode the subset of bits using TCM.

In accordance with yet another embodiment of the present invention, a computer readable medium for channel coding a plurality of bits is provided. The computer readable medium comprises a set of executable instructions adapted to manipulate a processor to encode a least-significant bit of the plurality of bits using turbo coding or low density parity check (LDPC) coding and encode a subset of the plurality of bits using trellis coded modulation (TCM), the subset of bits excluding the least-significant bit. The set of executable instructions may further comprise instructions adapted to manipulate a processor to map at least one symbol based at least in part on a result of the encoding of the least-significant bit and a result of the encoding of the subset of bits.

Other embodiments, uses, and advantages of the invention will be apparent to those skilled in the art from consideration of the specification and practice of the invention disclosed herein. The specification and drawings should be considered exemplary only, and the scope of the invention is accordingly intended to be limited only by the following claims and equivalents thereof.

What is claimed is:

1. A method for encoding a plurality of bits in a word, the method comprising:

encoding a subset of the plurality of bits using trellis coded modulation, the subset of bits excluding a least-significant bit; and encoding the least-significant bit of the plurality of bits using a second encoding technique, wherein the second encoding technique comprises at least one of turbo coding, block turbo coding, and low density parity check coding.

2. The method according to claim 1, wherein the subset of the plurality of bits includes a next-to-least significant bit.

3. The method according to claim 1, further comprising mapping data to at least one symbol, the data comprising a result of said encoding the least-significant bit and a result of said encoding the subset of the plurality of bits.

4. The method according to claim 3, wherein said mapping comprises four-dimensional mapping.

5. The method according to claim 1, further comprising mapping data to at least one symbol, the data comprising a result of said encoding the least-significant bit, a result of said encoding the subset of the plurality of bits, and a second plurality of bits in the word.

6. The method according to claim 5, wherein said mapping includes four-dimensional mapping.

7. The method according to claim 1, wherein the trellis coded modulation conforms to International Telecommunications Union Recommendation G.922.1.

8. A system for encoding a plurality of bits in a word, the system comprising:

a first encoder configured to encode a subset of the plurality of bits using trellis coded modulation, the subset of the plurality of bits excluding a least-significant bit; and a second encoder configured to encode the least-significant bit of the plurality of bits using a second encoding technique, wherein the second encoding technique comprises at least one of turbo encoding, block turbo coding, and low density parity check coding.

9. The system according to claim 8, wherein the subset of the plurality of bits includes the next-to-least significant bit.

10. The system according to claim 8, further comprising logic configured to map data to at least one symbol, the data comprising a result of encoding the least-significant bit and a result of encoding the subset of the plurality of bits.

11. The system according to claim 10, wherein said logic configured to map data uses four-dimensional mapping.

12. The system according to claim 8, further comprising logic configured to map data to at least one symbol, the data comprising a result of encoding the least-significant bit, a result of encoding the subset of the plurality of bits, and a second plurality of bits in the word.

13. The system according to claim 12, wherein said logic configured to map data uses four-dimensional mapping.

14. The method according to claim 8, wherein the trellis coded modulation conforms to International Telecommunications Union Recommendation G.922.1.

15. A system for encoding a plurality of bits in a word, the system comprising:

means for encoding a subset of the plurality of bits using trellis coded modulation, the subset of the plurality of bits excluding a least-significant bit; and means for encoding the least-significant bit of the plurality of bits using a second encoding technique, wherein the second encoding technique comprises at least one of turbo coding, block turbo coding, and low density parity check coding.

16. The system according to claim 15, further comprising means for mapping data to at least one symbol, the data comprising a result of the encoding the least-significant bit and a result of encoding the subset of plurality of bits.

17. The system according to claim 15, wherein said means for encoding the least-significant bit comprises means for encoding the least significant bit using at least one of turbo coding, block turbo coding, and low density parity check coding.

18. The system according to claim 15, wherein the trellis coded modulation conforms to International Telecommunications Union Recommendation G.922.1.

19. A computer-readable medium encoded with a set of instructions configured to control a processor to encode a plurality of bits in a word, the set of instructions being configured to control the processor to:
    encode a subset of the plurality of bits using trellis coded modulation, the subset of the plurality of bits excluding a least-significant bit; and
    encode the least-significant bit of the plurality of bits using a second encoding technique, wherein the second encoding technique comprises at least one of turbo coding, block turbo coding, and low density parity check coding.

20. The computer readable medium according to claim 19, further comprising instructions configured to control a processor to map data to at least one symbol, the data comprising a result of encoding the least-significant bit and a result of encoding the subset of the plurality of bits.

21. The method according to claim 19, wherein the trellis coded modulation conforms to International Telecommunications Union Recommendation G.922.1.

22. A method for encoding a plurality of bits in a binary word comprising:
    encoding a subset of the plurality of bits using trellis coded modulation, the subset of bits excluding a least-significant bit;
    encoding the least-significant bit of the plurality of bits using a second encoding technique, the second encoding technique comprising at least one of turbo encoding, block turbo encoding, and low density parity check encoding; and mapping, to at least one symbol, data comprising a result of encoding the least-significant bit, a result of encoding the subset of the plurality of bits, and a second plurality of bits in the binary word.

* * * * *